United States Patent
Cho et al.

(10) Patent No.: US 8,698,179 B2
(45) Date of Patent: Apr. 15, 2014

(54) CATHODE FOR ORGANIC LIGHT EMITTING DEVICE AND ORGANIC LIGHT EMITTING DEVICE USING THE CATHODE

(75) Inventors: Sang-Hwan Cho, Yongin-si (KR); Yoon-Hyeung Cho, Yongin-si (KR); Byoung-Duk Lee, Yongin-si (KR); Min-Ho Oh, Yongin-si (KR); Yong-Tak Kim, Yongin-si (KR); So-Young Lee, Yongin-si (KR); Yun-Ah Chung, Yongin-si (KR); Seung-Yong Song, Yongin-si (KR); Jong-Hyuk Lee, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/443,731

(22) Filed: Apr. 10, 2012

(65) Prior Publication Data

US 2012/0319151 A1    Dec. 20, 2012

(30) Foreign Application Priority Data

Jun. 20, 2011 (KR) .................. 10-2011-0059561

(51) Int. Cl.
*H01L 33/42* (2010.01)
(52) U.S. Cl.
USPC ................. 257/98; 257/40; 257/E33.064
(58) Field of Classification Search
USPC ....................... 257/98, 40, E33.064
See application file for complete search history.

(56) References Cited

FOREIGN PATENT DOCUMENTS

| JP | 2009-021574 A | 1/2009 |
|---|---|---|
| KR | 10-2002-0069319 A | 8/2002 |
| KR | 10-2004-0015346 A | 2/2004 |
| KR | 10-2006-0120503 A | 11/2006 |

*Primary Examiner* — Long Pham
(74) *Attorney, Agent, or Firm* — Knobbe Martens Olson & Bear LLP

(57) ABSTRACT

In one aspect, a cathode including the first metal layer, the transparent conductive layer formed on the first metal layer, and the second metal layer formed on the transparent conductive layer is applied to the organic light emitting device and thicknesses of the first metal layer, the transparent conductive layer, and the second metal layer are controlled so that the external light reflection of the organic light emitting device is prevented. The cathode may further include the third metal layer formed on the second metal layer.

18 Claims, 13 Drawing Sheets

CATHODE FOR ORGANIC LIGHT EMITTING DEVICE AND ORGANIC LIGHT EMITTING DEVICE USING THE CATHODE

CROSS-REFERENCE TO RELATED APPLICATIONS

This application claims priority to and the benefit of Korean Patent Application No. 10-2011-0059561 filed in the Korean Intellectual Property Office on Jun. 20, 2011, the disclosure of which is incorporated herein by reference in its entirety.

BACKGROUND

1. Field

The present embodiments relates to a cathode for an organic light emitting device and an organic light emitting device using the cathode, and more particularly to a cathode for an organic light emitting device configured to prevent the reflection of external light and an organic light emitting device using the cathode.

2. Description of the Related Technology

An electroluminescent device, especially an organic light emitting device is a device using light generated when electrons and holes are combined and dissipate to emit light.

An electroluminescent device can include an electrode for injecting holes, an electrode for injecting electrons, and a light emitting layer, and has a lamination structure in which the light emitting layer is interposed between the electrode for injecting the holes and the electrode for injecting the electrons. Among the electroluminescent devices, a device including a light emitting layer formed of a monomer organic material or a polymer is especially called a "organic light emitting device".

Recent technologies for replacing the circularly polarizing plate have poor emission efficiency.

Methods of using an optical interference filter, which prevents the reflection through a destructive interference of reflected lights by using a metal-dielectric multi-layered thin film has limitations on the optical interference filter having to function as an electrode of the organic light emitting device. Although the electrode of an organic light emitting device should have the work function of a proper range in order to smoothly inject a charge (hole, electron) to the light emitting layer, the optical interference filter cannot have the work function required for functioning as the electrode of the organic light emitting device. As a result, the injection of the hole or the electron is not smooth in the electrode of the organic light emitting device, which makes the emission efficiency of the organic light emitting device deteriorated.

SUMMARY

Some embodiments provide a cathode for an organic light emitting device, which can effectively reduce the external light reflection without deteriorating the emission efficiency of the organic light emitting device, and the organic light emitting device including the cathode.

Some embodiments provide a cathode for an organic light emitting device, which can prevent the external light reflection by the destructive interference by the multi-layered thin film including a metal layer and a transparent conductive layer, and an organic light emitting device using the cathode.

Some embodiments provide a method for fabricating an organic light emitting device, which can prevent the external light reflection by controlling a thickness of each layer of the multi-layered thin film, in the organic light emitting device including the cathode having a multi-layered thin film structure including a metal layer and a transparent conductive layer.

Some embodiments provide a organic light emitting device, which can efficiently prevent the external light reflection.

In accordance with an aspect of the present embodiments, there is provided an organic light emitting device including: a substrate; a first electrode formed on the substrate; an organic layer formed on the first electrode; and a second electrode formed on the organic layer, wherein one of the first electrode and the second electrode is a cathode including a first metal layer, a transparent conductive layer, and a second metal layer, and destructive interference is generated between a light reflected from the first metal layer and lights reflected from the transparent conductive layer and the second metal layer.

In some embodiments, a thickness of the first metal layer is in a range of 50 nm to 500 nm.

In some embodiments, the first metal layer includes one selected from the group consisting of Al, Ag, Mg, Cr, Ti, Ni, Au, Ta, Cu, Ca, Fe, Mo, W, Pt, Yb, and Ba, or an alloy thereof.

In some embodiments, an optical thickness of the transparent conductive layer is in a range of $0.15\lambda$ to $0.35\lambda$ for a wavelength $\lambda$ of a visible ray.

In some embodiments, a thickness of the transparent conductive layer is in a range of 20 nm to 100 nm.

In some embodiments, the transparent conductive layer includes one selected from the group consisting of ITO (indium tin oxide), AZO (aluminum zinc oxide), IGO (indium gallium oxide), GIZO (gallium indium zinc oxide), IZO (indium zinc oxide), and $ZnO_x$, or a mixture thereof.

In some embodiments, the transparent conductive layer further includes at least one of a metal and a dielectric material.

In some embodiments, the second metal layer includes a component selected from the group consisting of Cr, Ti, Mg, Mo, Co, Ni, W, Al, Ag, Au, Cu, Fe, Ca, Pt, and Yb, or an alloy thereof of two or more thereof.

In some embodiments, a thickness of the second metal layer is in a range of 1 nm to 25 nm.

In some embodiments, a third metal layer may be further formed on the second metal layer, and a destructive interference between a light reflected from the third metal layer and the light reflected from the first metal layer is generated.

In some embodiments, the third metal layer is formed of a metal having a work function lower than 4.6 eV or an alloy of the metal.

In some embodiments, the third metal layer is formed of a metal having a work function lower than 3.7 eV or an alloy of the metal, which more improves the efficiency of the electron injection.

In some embodiments, the third metal layer includes one selected from the group consisting of Yb, Ca, Al, Ag, Cr, Ti, Mg, Li, Cs, Ba, and K, or an alloy thereof.

In some embodiments, a thickness of the third metal layer is in a range of 1 nm to 15 nm.

According to an exemplary embodiment of the present embodiments, the cathode is the first electrode. In this case, the first electrode is a reflective electrode.

In some embodiments, the second electrode is a transparent electrode and a transparent plate is disposed on the second electrode. In this case, the transparent plate may function as a protective plate.

In some embodiments, there is provided a cathode for an organic light emitting device including: a first metal layer; a transparent conductive layer formed on the first metal layer; and a second metal layer formed on the transparent conductive layer, wherein a destructive interference between a light reflected from the first metal layer and lights reflected from the transparent conductive layer and the second metal layer is generated.

In some embodiments, a third metal layer is additionally formed on the second metal layer and a destructive interference between a light reflected from the third metal layer and the light reflected from the first metal layer is generated.

In some, the first metal layer, the transparent conductive layer, the second metal layer, and the third metal layer of the cathode for the organic light emitting device according to the present embodiments are the same as the aforementioned description.

In some embodiments, there is provided a method for fabricating an organic light emitting device which can efficiently prevent the external light reflection. The method for fabricating the organic light emitting device includes the steps of: preparing a substrate; forming a cathode on the substrate; forming an organic layer on the cathode; and forming an anode on the organic layer, wherein forming the cathode includes: forming a first metal layer on the substrate; forming a transparent conductive layer on the first metal layer; and forming a second metal layer on the transparent conductive layer, and wherein thicknesses of the first metal layer, the transparent conductive layer, and the second metal layer are controlled so that a destructive interference between a light reflected from the first metal layer and lights reflected from the transparent conductive layer and the second metal layer is generated.

In some embodiments, the method further includes forming a third metal layer on the second metal layer after forming the second metal layer, wherein thicknesses of the first metal layer, the transparent conductive layer, the second metal layer, and the third metal layer are controlled so that a destructive interference between the light reflected from the first metal layer and lights reflected from the transparent conductive layer, the second metal layer, and the third metal layer is generated.

DETAILED DESCRIPTION

Figure 1:
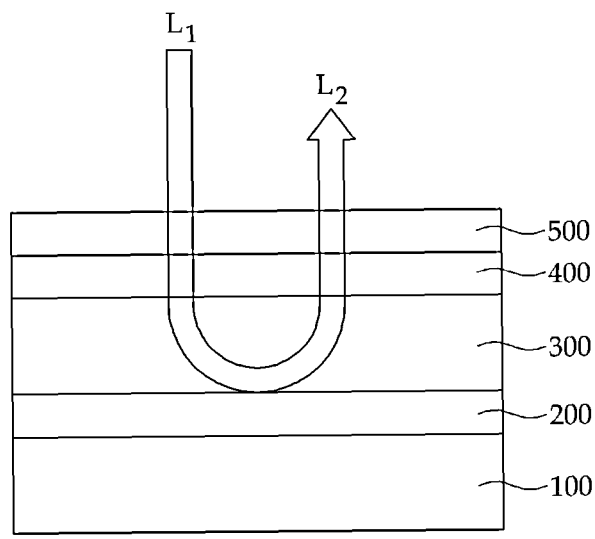
FIG. 1 is a view schematically illustrating a conventional structure of an organic light emitting device.

Hereinafter, exemplary embodiments will be described with reference to the accompanying drawings. However, the scope of the present embodiments is not limited to the embodiments or the drawings.

Meanwhile, each element and shape in the drawings may be briefly or exaggeratingly illustrated to assist the understanding. In the drawings, the same reference numerals are used to designate the same components. Further, in the following description, when it is said that a layer is "on" another layer or a substrate, it will be understood that the layer is positioned either directly on or above said another layer or the substrate, or a third layer positioned between them.

FIG. 1 schematically illustrates a general structure of the organic light emitting device. Referring to FIG. 1, the organic light emitting device basically has a structure in which a first electrode 200 can be formed on a substrate 100, an organic layer 300 can be formed on the first electrode 200, and a second electrode 400 can be formed on the organic layer. A transparent plate 500 can be disposed on the second electrode 400 as necessary. The transparent plate 500 has a function of protecting the organic light emitting device. A light emitting layer, in which a hole and an electron are combined and dissipate while emitting light, can be included in the organic layer 300. Further, one electrode selected from the first electrode and the second electrode can be an anode for injecting hole, and the other can be a cathode for injecting electron.

Figure 2:
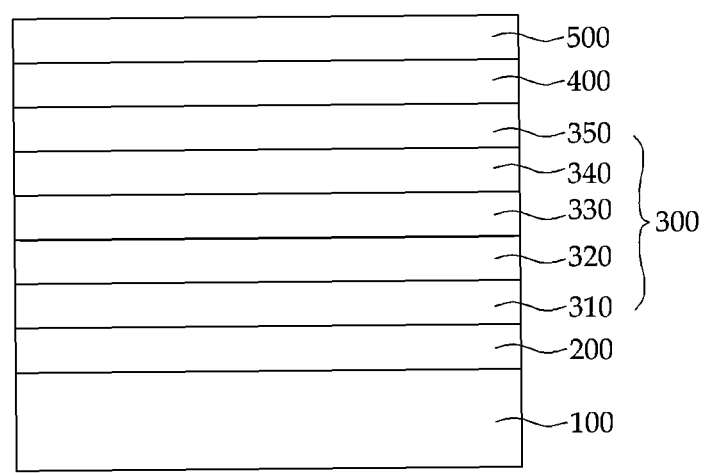
FIG. 2 illustrates that the organic layer 300 has a multi-layered stacked structure in the organic light emitting device of FIG. 1.

FIG. 2 illustrates the organic layer 300 of the organic light emitting device having a multi-layered stacked structure. The organic layer 300 includes a hole injection layer, a hole transfer layer, a light emitting layer, an electron transport layer, and an electron injection layer, which are sequentially arranged from the anode. When the first electrode is the anode, the hole injection layer 310, the hole transfer layer 320, the light emitting layer 330, the electron transport layer 340, and the electron injection layer 350 are sequentially disposed from the first electrode 200. On the contrary, when the first electrode is the cathode, the electron injection layer 310, the electron transport layer 320, the light emitting layer 330, the hole transfer layer 340, and the hole injection layer 350 are sequentially disposed from the first electrode layer 200. For reference, the electron injection layer may be considered as a separate layer, instead of being included in the organic layer because the electron injection layer is mainly formed of metal elements or a compound thereof.

In the organic light emitting device, a contrast may be deteriorated due to outside light (external light). In FIG. 1, the arrow indicates that the external light L1 is reflected from the first electrode 200. Here, L2 represents reflected light. Because of the reflected light L2, the contrast of the organic light emitting device is deteriorated.

Figure 3:
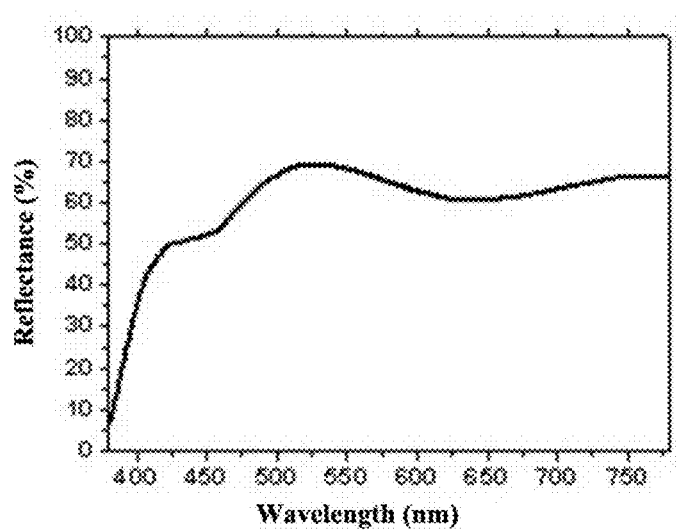
FIG. 3 is a graph illustrating the external light reflection of a conventional organic light emitting device.

FIG. 3 is a graph illustrating the external light reflection in a general organic light emitting device. FIG. 3 shows the luminous reflectance, and the luminous reflectance in the general organic light emitting device maximally reaches 66%. Such the high reflectance make the contrast of the device significantly deteriorated.

Figure 4:
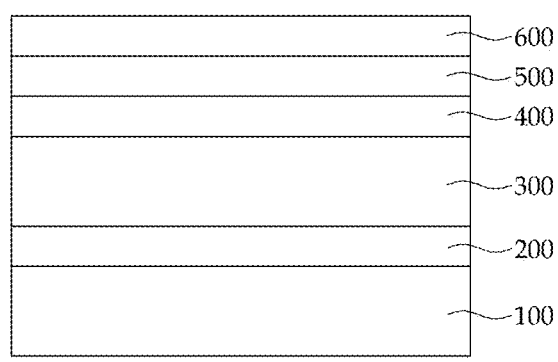
FIG. 4 illustrates that the circularly polarizing plate 600 is attached to the transparent plate 500 of the organic light emitting device of FIG. 1.

In order to solve the above problem, a reflection preventing plate can be stuck to a light emitting surface of the organic light emitting device, to prevent the reflection. FIG. 4 illustrates that a circularly polarizing plate 600 is attached to the transparent plate 500, which is the light emitting surface, as the reflection preventing plate. In this case, the external light reflection may be reduced lower than 5%.

Figure 5:
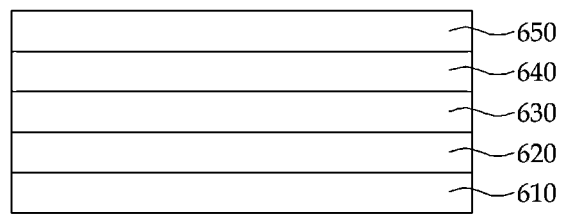
FIG. 5 is a view schematically illustrating a stacked structure of the circularly polarizing plate 600 shown in FIG. 4.

However, there are some problems in using the circularly polarizing plate. In general, the circularly polarizing plate 600 has a multi-layered structure as shown in FIG. 5. For example, the circularly polarizing plate 600 includes an adhesive layer 610, a ¼ wavelength plate 620, a first protective layer 630, a linearly polarizing plate 640, and a second protective layer 650. The circularly polarizing plate has a thickness of 0.15 nm to 0.3 nm. Therefore, there can be a limitation in applying the circularly polarizing plate to an ultra thin display. Further, a laminating process for forming the multi-layered structure is required and the cost of production is increased by using the above additional components in a manufacturing process of the organic light emitting device.

In addition, when the circularly polarizing plate 600 is used, the brightness of the organic light emitting device can be reduced. The transmittance of the circularly polarizing plate is about 45%. When such a circularly polarizing plate is used, light generated from the organic light emitting device can be absorbed in the circularly polarizing plate so that the brightness of the organic light emitting device can be reduced.

Figure 6:
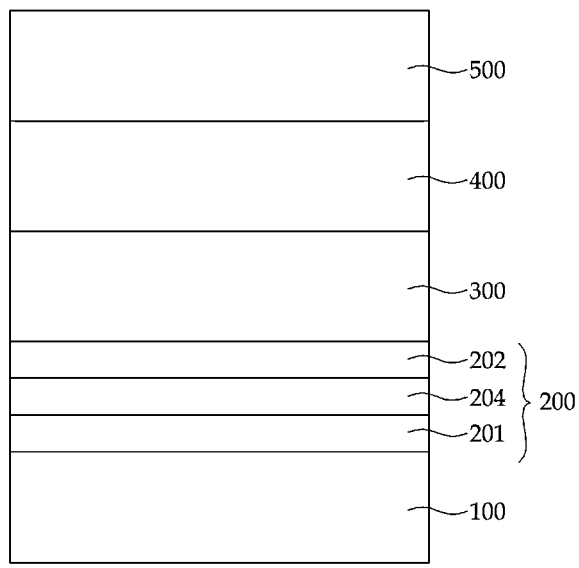
FIG. 6 is a view schematically illustrating a structure of the organic light emitting device according to an example of the present embodiments.

Referring to FIG. 6, the organic light emitting device includes a substrate 100, a first electrode 200 formed on the substrate, an organic layer 300 formed on the first electrode, and a second electrode 400 formed on the organic layer. A transparent plate 500 is disposed on the second electrode 400 as a protective layer.

FIG. 6 illustrates an example in which the first electrode 200 formed on the substrate 100 is a cathode and the second electrode 400 is an anode. The cathode is a reflective electrode, the anode is a transparent electrode, and light emitting surfaces is anode direction.

The cathode 200 according to the present embodiments includes a first metal layer 201 formed on the substrate, a transparent conductive layer 204 formed on the first metal layer, and a second metal layer 202 formed on the transparent conductive layer. The destructive interference occurs between the light reflected from the first metal layer 201 of the cathode and the lights reflected from the transparent conductive layer 204 and the second metal layer 202 of the cathode.

Figure 7:
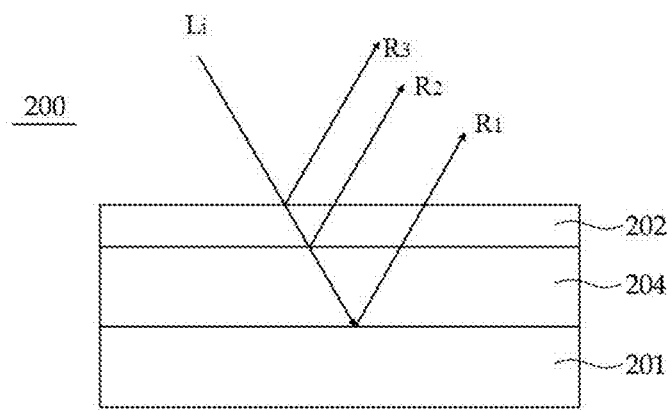
FIG. 7 is a view schematically illustrating a structure of the cathode for the organic light emitting device according to an example of the present embodiments and the external light reflection reflected from the cathode.

FIG. 7 illustrates a structure of the cathode of the organic light emitting device and the external light reflection in the cathode according to an example of the present embodiments.

Specifically, in FIG. 7, $L_i$ represents the external light incident to the organic light emitting device. The external light $L_i$ is reflected from each of the first metal layer 201 (R1), the transparent conductive layer 204 (R2), and the second metal layer 202 (R3). The first metal layer is a base metal layer and an amount of the external light reflection in the first metal layer may be the largest. When the light reflected from the first metal layer is directly radiated to the light emitting surface, a contrast characteristic of the organic light emitting device is deteriorated.

In the cathode of the organic light emitting device according to the present embodiments, the destructive interference occurs between the lights R2 and R3 reflected from the transparent conductive layer 204 and the second metal layer 202 and the light R1 reflected from the first metal layer 201, so that an amount of the reflected light radiating to the light emitting surface can be reduced. When a size of a sum of the lights R2+R3 reflected from the transparent conductive layer 204 and the second metal layer 202 is identical to that of the light R1 reflected from the first metal layer 201 but a phase of the sum of the lights R2+R3 reflected from the transparent conductive layer 204 and the second metal layer 202 is diametrically opposed to that of the light R1 reflected from the first metal layer 201 (phase difference 180°), the dissipation interference occurs so that the external light reflection may dissipate.

According to the present embodiments, the destructive interference between the light R1 reflected from the first metal layer 201 and the lights R2 and R3 reflected from the transparent conductive layer 204 and the second metal layer 202 can be controlled by controlling thicknesses of the first metal layer 201, the transparent conductive layer 204, and the second metal layer 202, which maximally restrains the external light reflection.

According to an example of the present embodiments, the first metal layer 201 is the base metal of a lower part of the cathode for the organic light emitting device. And thus, it is preferable that the first metal layer 201 has a small resistance in order to have an excellent electrical conductivity and is formed of such metal materials as can stably develop in a thermal vapor deposition. Further, a metal having a small reaction to oxygen and water is more suitable for the first metal layer 201, in consideration of a life span of the device. According to an example of the present embodiments, the first metal layer may include a component selected from the group consisting of Al, Ag, Mg, Cr, Ti, Ni, Au, Ta, Cu, Ca, Co, Fe, Mo, W, Pt, Yb, and Ba, or an alloy thereof of two or more thereof.

A thickness of the first metal layer may be in a range of 50 nm to 500 nm. It is preferable that the first metal layer is thick when the electrical conductivity should be considered. However, it is also preferable that the first metal layer is thin for the thinning of the device. Therefore, a moderate thickness of the first metal layer is in a range of 50 nm to 500 nm.

The transparent conductive layer 204 should have the conductivity since it is applied to the cathode, and the transparent conductive layer 204 should be transparent since the light should penetrate the transparent conductive layer 204.

Accordingly, the transparent conductive layer 204 may be formed of transparent conductive materials. According to an example of the present embodiments, the transparent conductive layer may include one selected from the group consisting of ITO, AZO, IGO, GIZO, IZO, and $ZnO_x$, or a mixture thereof.

According to an example of the present embodiments, the transparent conductive layer 204 may include at least one of a metal and a dielectric material.

Meanwhile, in order to achieve occurrence of the destructive interference between the light reflected from the first metal layer and the lights reflected from the rest of the cathode layers, the transparent conductive layer 204 generates the phase difference between the reflected lights. When the thickness of the transparent conductive layer 204 is changed, a route of the light, which is incident to each layer and then reflected, can also be changed, so that the phase difference is generated.

In order to achieve occurrence of the dissipation interference between the reflected lights, a relative phase difference between the reflected lights should be 180°. In order to achieve occurrence of the destructive interference when it is difficult to generate the dissipation interference, the phase difference of the reflected lights should be around 180°.

Accordingly, in the present embodiments, the relative phase difference of the reflected lights can be controlled by adjusting the thickness of the transparent conductive layer 204.

In order to control the phase difference of the reflected lights, it is preferable that an optical thickness of the transparent conductive layer 204 is near $0.25\lambda$, for a wavelength $\lambda$ of an incident wave. Therefore, according to an example of the present embodiments, the optical thickness of the transparent conductive layer 204 may be in a range of $0.15\lambda$ to $0.35\lambda$ for a wavelength $\lambda$ of a visible ray.

Figure 8:
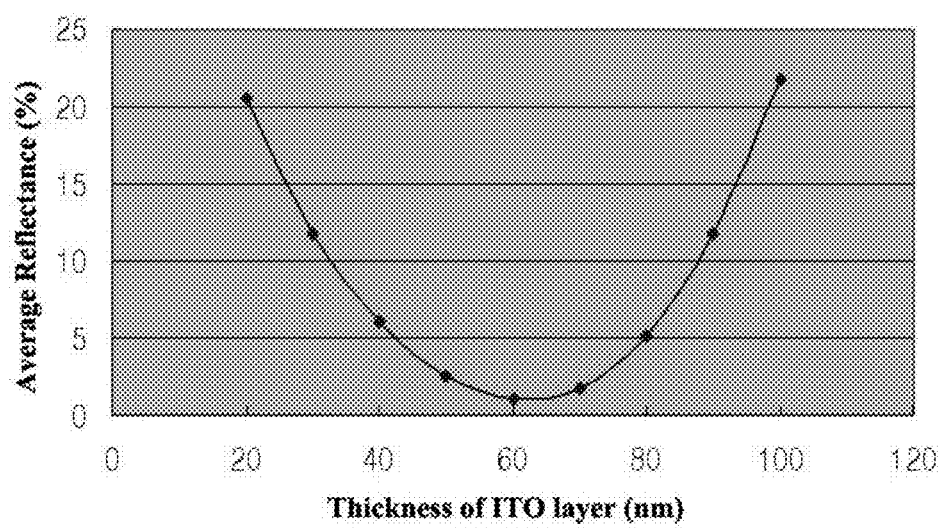
FIG. 8 illustrates the average reflectance in a visible light region depending on thicknesses of the transparent conductive layer 204.

FIG. 8 illustrates the average reflectance in a visible light region depending on the thickness of the transparent conductive layer 204 (ITO layer) in the cathode for the organic light emitting device according to the present embodiments. Referring to FIG. 8, when the thickness of the transparent conductive layer 204 (ITO layer) is in a range of 20 nm to 100 nm, the reflectance is lower than 25%. Therefore, according to an example of the present embodiments, the thickness of the transparent conductive layer 204 can be in a range of about 20 nm to 100 nm.

The light R2 reflected from the transparent conductive layer 204 and the light R1 reflected from the first metal layer are offset through the destructive interference.

The light R3 reflected from the second metal layer 202 and the light R1 reflected from the first metal layer are offset through the destructive interference. In order to achieve occurrence the dissipation interference, a phase of the light R3 reflected from the second metal layer 202 should be opposite to a phase of the light R1 reflected from the first metal layer 201 and a size of the light R3 reflected from the second metal layer 202 should be identical to a size of the light R1 reflected from the first metal layer 201. In order to achieve occurrence of the destructive interference when it is difficult to generate the dissipation interference, an intensity of the light R3 reflected from the second metal layer should be similar to an intensity of the light R1 reflected from the first metal layer. Therefore, it is preferable that the second metal layer 202 has a light absorbing characteristic because a metal having a good light absorbance can absorb the reflected light, which does not entirely dissipate by the destructive interference. The light absorption of metal is proportional to the product of the reflectance and a light absorption coefficient. Therefore, as a metal has a higher value obtained by multiplexing the reflectance and the absorption coefficient, the metal is more suitable for the second metal layer.

According to an example of the present embodiments, the second metal layer 202 may include one selected from a group of Cr, Ti, Mg, Mo, Co, Ni, W, Al, Ag, Au, Cu, Fe, Ca, Pt, and Yb, or an alloy of two or more thereof.

According to an example of the present embodiments, the thickness of the second metal layer may be in a range of 1 nm to 25 nm.

Figure 9:
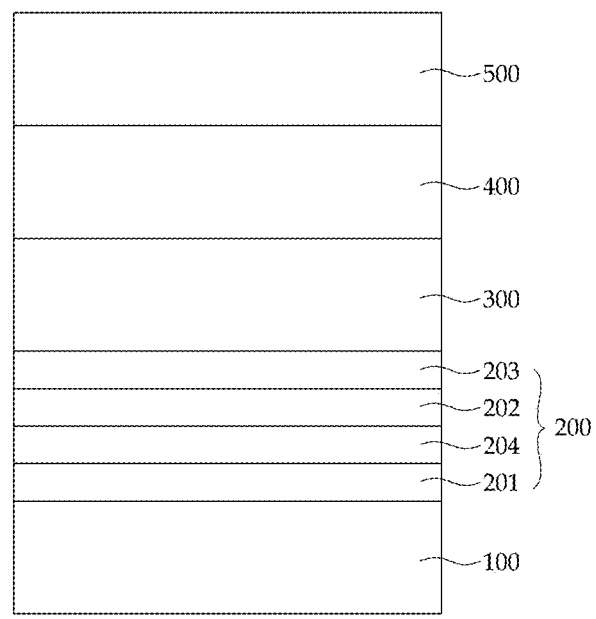
FIG. 9 is a view schematically illustrating a structure of the organic light emitting device according to an example of the present embodiments.
Figure 10:
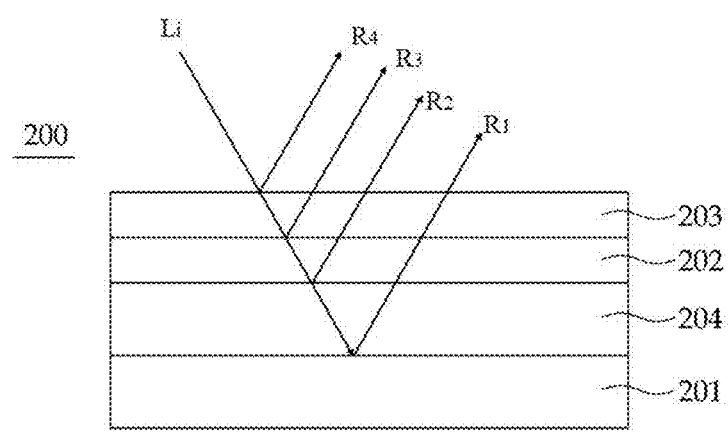
FIG. 10 is a view schematically illustrating a structure of the cathode for the organic light emitting device according to an example of the present embodiments and the external light reflection reflected from the cathode.

FIG. 9 illustrates the organic light emitting device having the cathode 200 in which a third metal layer 203 is additionally formed on the second metal layer 202. FIG. 10 illustrates a structure of the cathode 200 and the light reflection in the cathode. Here, a light R4 reflected from the third metal layer 203 is also configured to generate the destructive interference with the light R1 reflected from the first metal layer 201.

The third metal layer 203 enables a charge (electron) introduced into cathode 200 to easily move to the organic layer 300, to help the cathode 200 in performing its own function as the cathode of the organic light emitting device.

Accordingly, it is preferable that the third metal layer 203 has a low work function and a low reaction to oxygen and water. According to an example of the present embodiments, the third metal layer may be formed of a metal having a work function lower than 4.6 eV or an alloy of the metal. According to an example of the present embodiments, by forming the third metal layer with a metal having a work function lower than 3.7 eV or an alloy of the metal, the efficiency of an electron injection can be improved.

According to an example of the present embodiments, the third metal layer comprises one selected from the group consisting of Yb, Ca, Al, Ag, Cr, Ti, Mg, Li, Cs, Ba, and K, or an alloy of two or more thereof.

In some embodiments, a thickness of the third metal layer may be controlled in a range of 1 nm to 15 nm.

Figure 11:
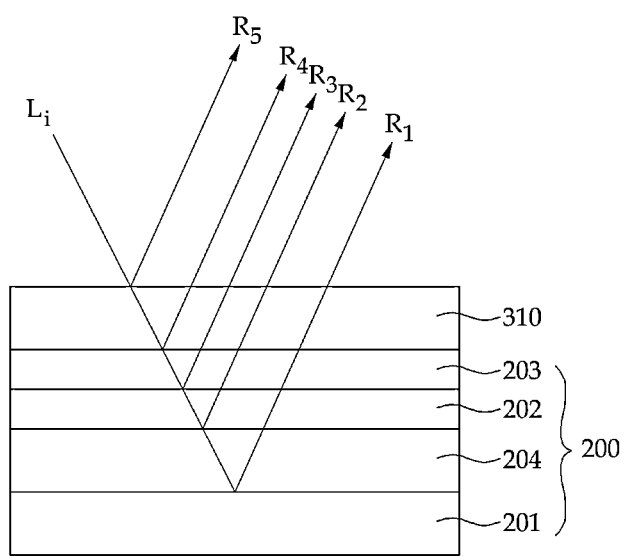
FIG. 11 illustrates the external light reflection in the cathode for the organic light emitting device according to an example of the present embodiments.

Meanwhile, FIG. 11 illustrates the reflection generated in the cathode of the organic light emitting device considering the reflection generated in an electron injection layer 310. A light R5 reflected from the electron injection layer 310 can be also involved in the destructive interference with the light R1 reflected from the first metal layer.

As described above, the present embodiments provides the cathode 200 for the organic light emitting device and the organic light emitting device including the cathode 200. The cathode 200 includes the first metal layer 201, the transparent conductive layer 204 formed on the first metal layer, and the second metal layer 202 formed on the transparent conductive layer, and the light R1 reflected from the first metal layer undergoes the destructive interference with the lights R2 and R3 reflected from the transparent conductive layer and the second metal layer.

According to the present embodiments, it is possible to reduce the external light reflection of the organic light emitting device without using a circularly polarizing plate.

A method for fabricating an organic light emitting device can include the steps of preparing the substrate 100; forming the cathode 200 on the substrate; forming the organic layer 300 on the cathode; and forming the anode 400 on the organic layer. Further, the step of forming the cathode includes forming the first metal layer 201 on the substrate; forming the transparent conductive layer 204 on the first metal layer; and forming the second metal layer 202 on the transparent conductive layer. Here, the organic light emitting device is manufactured by controlling the thicknesses of the first metal layer, the transparent conductive layer, and the second metal layer so that the destructive interference between the light reflected from the first metal layer and the lights reflected from the transparent conductive layer and the second metal layer is generated.

According to an example of the present embodiments, the method may further include a step of forming the third metal layer 203 on the second metal layer after forming the second metal layer 202. Here, the thicknesses of the first metal layer, the transparent conductive layer, the second metal layer, and the third metal layer are controlled so that the destructive interference between the light reflected from the first metal layer and the lights reflected from the transparent conductive layer, the second metal layer, and the third metal layer occurs.

Hereinafter, selected examples of the present embodiments will be described.

EXAMPLE 1

An aluminum (Al) layer having a thickness of 300 nm is formed on a glass substrate 100 as the first metal layer 201, an ITO layer having a thickness of 50 nm is formed as the transparent conductive layer 204, a chromium (Cr) layer is formed as the second metal layer 202, and an alloy layer of magnesium and silver (Mg:Ag) having a thickness of 2 nm is formed as the third metal layer 203, which manufactures the cathode 200 for the organic light emitting device. Meanwhile, a LiF layer having a thickness of 1 nm is additionally formed on the third metal layer as the electron injection layer.

Here, the chromium layer, which is the second metal layer, is manufactured while changing its thickness to 8 nm, 10 nm, 12 nm, and 14 nm. They are illustrated as examples 1-1 (Cr 8), 1-2 (Cr 10), 1-3 (Cr 12), and 1-4 (Cr 14), as shown in FIG. 12.

Figure 12:
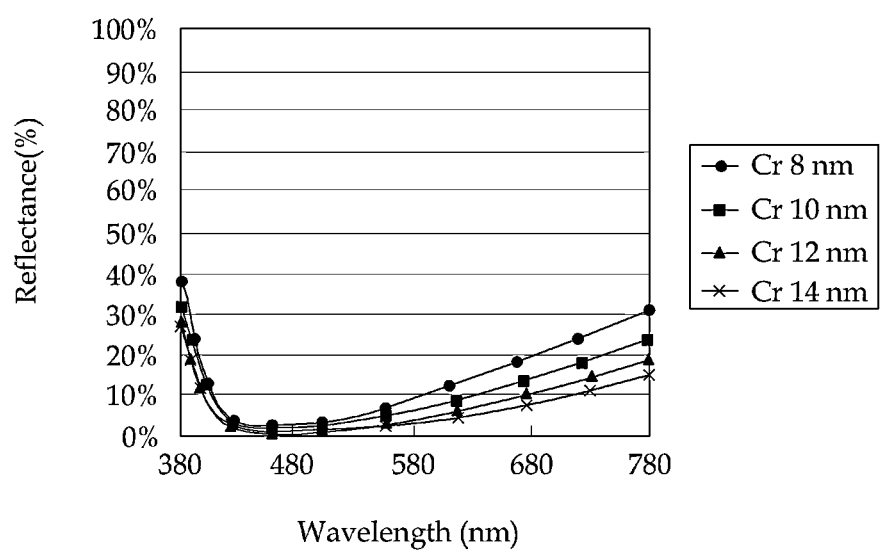
FIG. 12 is a graph illustrating the reflectance of the cathodes manufactured in example 1.

FIG. 12 illustrates the reflectance measured for each example.

As shown in FIG. 12, the reflectance of the cathode for the organic light emitting device manufactured in the present embodiments is very low compared to the reflectance of a general metal, which is 90%. Especially, when the thickness of the chromium (Cr) layer which is the second metal layer is 12 nm, the average reflectance of the visible light is about 3%.

EXAMPLE 2

Example 2 is implemented in the same manner as Example 1, but the thickness of the chromium (Cr) layer which is the second metal layer is fixed to 12 nm and the ITO layer which is the transparent conductive layer is manufactured while changing its thickness to 40 nm, 50 nm, and 60 nm. They are illustrated as Examples 2-1 (ITO 40 nm), 2-2 (ITO 50 nm), and 2-3 (ITO 60 nm), as shown in FIG. 13.

Figure 13:
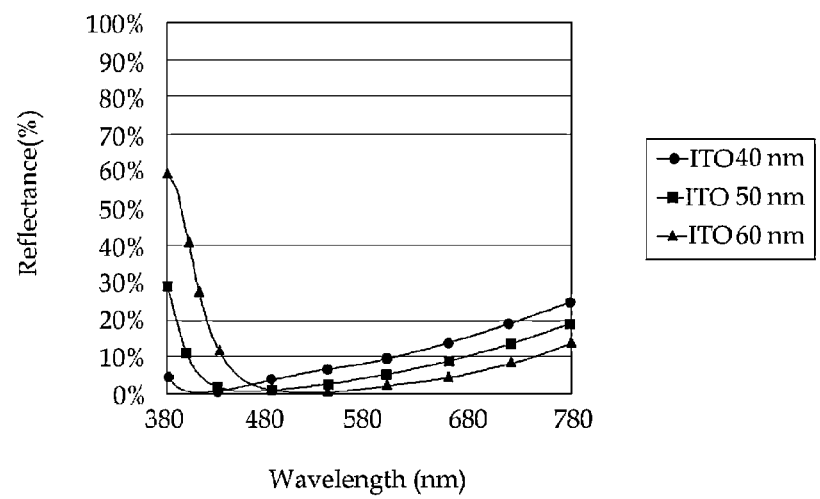
FIG. 13 is a graph illustrating the reflectance of the cathodes manufactured in example 2.

FIG. 13 illustrates the reflectance measured for each example.

In some embodiments, an appropriate optical thickness of the ITO layer is around $0.25\lambda$ for maximizing the destructive interference.

EXAMPLE 3

Example 3 is implemented in the same manner as embodiment 2, but the thickness of the chrome (Cr) layer which is the second metal layer is fixed to 12 nm and the alloy layer of magnesium and silver (Mg:Ag) which is the third metal layer is manufactured while changing its thickness to 2 nm, 3 nm, 4 nm, and 5 nm. They are illustrated as embodiments 3-1 (Mg/Ag 2 nm), 3-2 (Mg/Ag 3 nm), 3-3 (Mg/Ag 4 nm), and 3-4 (Mg/Ag 5 nm), as shown in FIG. 14.

Figure 14:
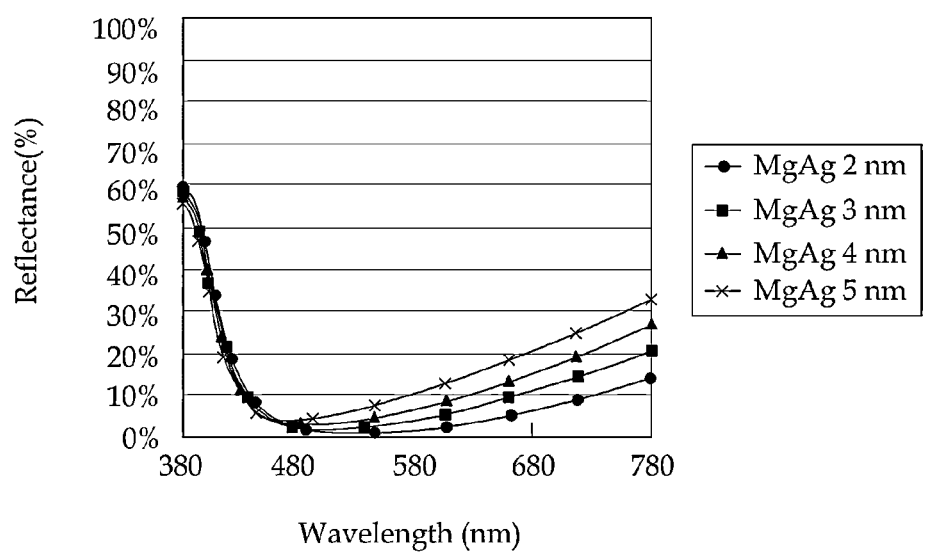
FIG. 14 is a graph illustrating the reflectance of the cathodes manufactured in example 3.

FIG. 14 illustrates the reflectance measured for each embodiment.

EXAMPLE 4

An aluminum (Al) layer having a thickness of 300 nm is formed on a glass substrate as the first metal layer, an ITO layer is formed as the transparent conductive layer, a chromium (Cr) layer having a thickness of 10 nm is formed as the second metal layer, which manufactures the cathode for the organic light emitting device. Meanwhile, a LiF layer having a thickness of 1 nm is additionally formed on the second metal layer as the electron injection layer.

Here, the ITO layer, which is the transparent conductive layer, is manufactured while changing its thickness to 30 nm, 40 nm, 50 nm, 60 nm, and 70 nm. They are illustrated as embodiments 4-1 (ITO 30 nm), 4-2 (ITO 40 nm), 4-3 (ITO 50 nm), 4-4 (ITO 60 nm), and 4-5 (ITO 70 nm), as shown in FIG. 15.

Figure 15:
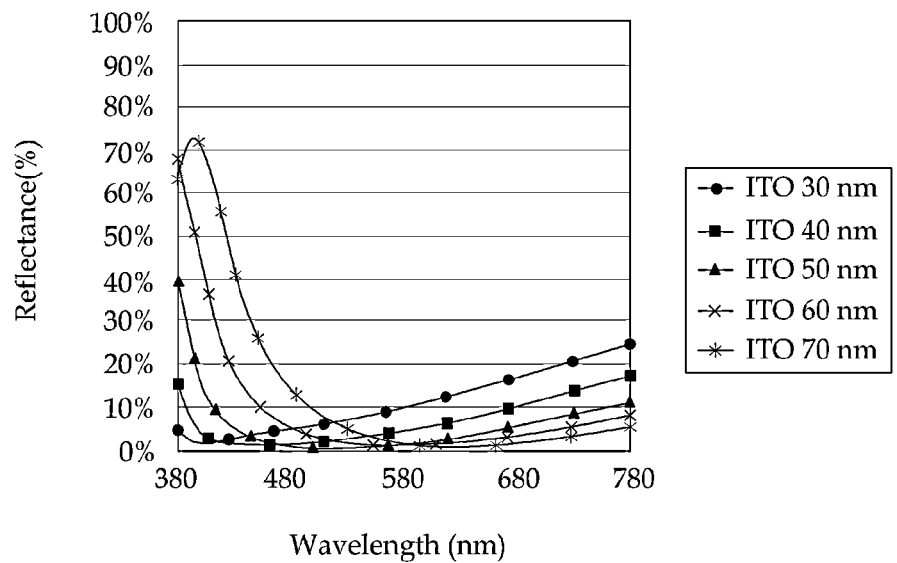
FIG. 15 is a graph illustrating the reflectance of the cathodes manufactured in example 4.

FIG. 15 illustrates the reflectance measured for each embodiment.

EXAMPLE 5

Example 5 is implemented in the same manner as example 4, but the thickness of the ITO layer, which is the transparent conductive layer, is fixed to 50 nm and the chromium (Cr) layer, which is the second metal layer, is manufactured while changing its thickness to 8 nm, 10 nm, 12 nm, and 14 nm. They are illustrated as embodiments 5-1 (Cr 8 nm), 5-2 (Cr 10 nm), 5-3 (Cr 12 nm), and 5-4 (Cr 14 nm), as shown in FIG. 16.

Figure 16:
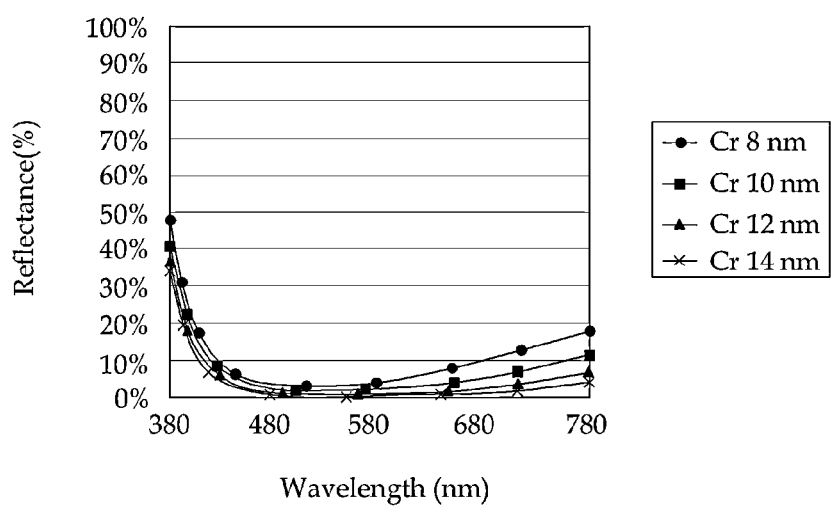
FIG. 16 is a graph illustrating the reflectance of the cathodes manufactured in example 5.

FIG. 16 illustrates the reflectance measured for each embodiment.

EXAMPLE 6

An aluminum (Al) layer having a thickness of 300 nm is formed on a glass substrate as the first metal layer, an ITO layer having a thickness of 60 nm is formed as the transparent conductive layer, and a titanium (Ti) layer is formed as the second metal layer, which manufactures the cathode for the organic light emitting device. Meanwhile, a LiF layer having a thickness of 1 nm is additionally formed on the second metal layer as the electron injection layer.

Here, the titanium (Ti) layer, which is the second metal layer, is manufactured while changing its thickness to 8 nm, 10 nm, and 12 nm. They are illustrated as embodiments 6-1 (Ti 8 nm), 6-2 (Ti 10 nm), and 6-3 (Ti 12 nm), as shown in FIG. 17.

Figure 17:
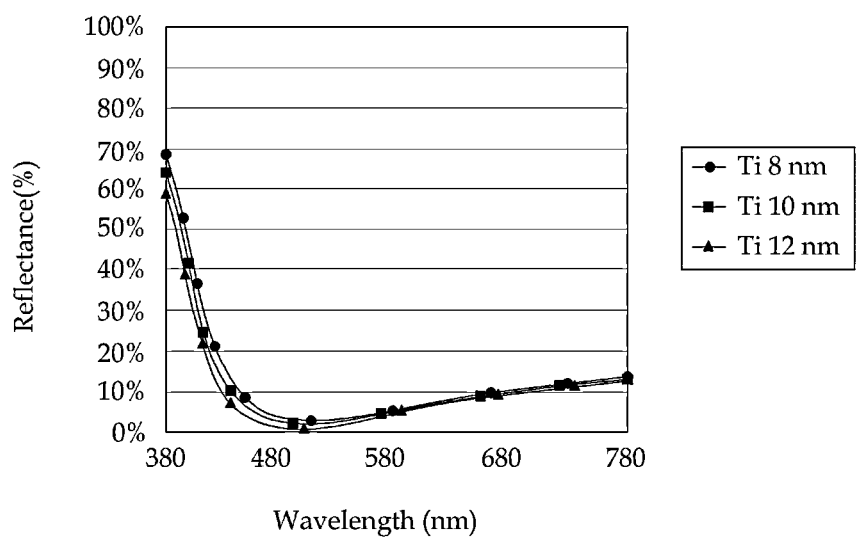
FIG. 17 is a graph illustrating the reflectance of the cathodes manufactured in example 6.

FIG. 17 illustrates the reflectance measured for each embodiment.

EXAMPLE 7

An aluminum (Al) layer having a thickness of 300 nm is formed on a glass substrate as the first metal layer, an ITO layer having a thickness of 60 nm is formed as the transparent conductive layer, a molybdenum (Mo) layer is formed as the second metal layer, and an ytterbium (Yb) layer having a thickness of 2 nm is formed as the third metal layer, which manufactures the cathode for the organic light emitting device. Meanwhile, a LiF layer having a thickness of 1 nm is additionally formed on the third metal layer as the electron injection layer.

Here, the molybdenum (Mo) layer, which is the second metal layer, is manufactured while changing its thickness to 6 nm, 8 nm, and 10 nm. They are illustrated as embodiments 7-1 (Mo 6 nm), 7-2 (Mo 8 nm), and 7-3 (Mo 10 nm), as shown in FIG. 18.

Figure 18:
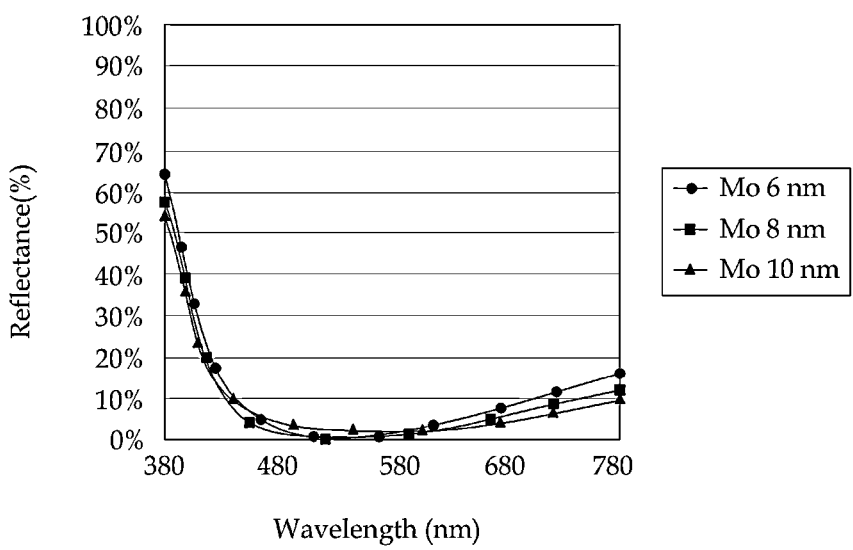
FIG. 18 is a graph illustrating the reflectance of the cathodes manufactured in example 7.

FIG. 18 illustrates the reflectance measured for each embodiment.

The ytterbium (Yb) has the work function of 3.1 eV, so the ytterbium (Yb) has a characteristic suitable for a material of the cathode. Referring to FIG. 18, when the thickness of the molybdenum (Mo) layer which is the second metal layer is 8 nm, the average reflectance of the visible light is only 1%.

REFERENCE EXAMPLE

Figure 19:
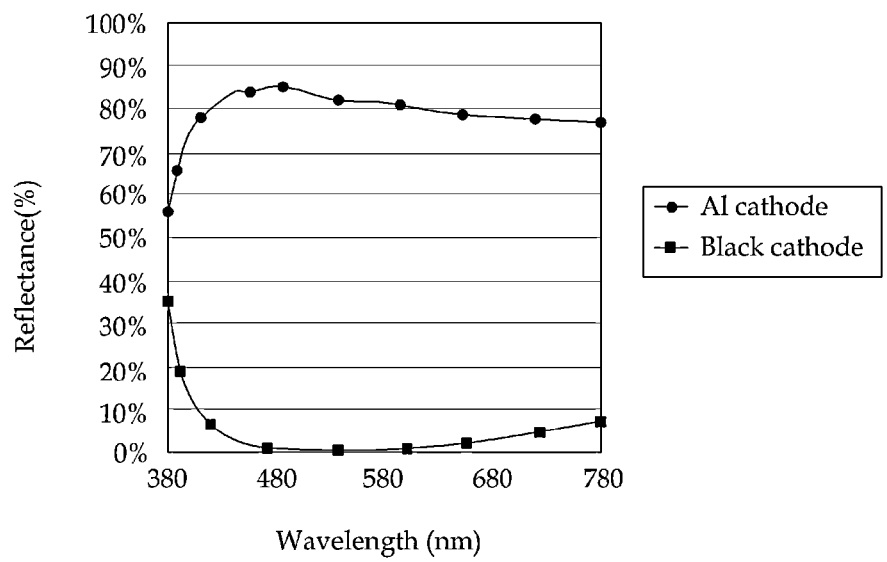
FIG. 19 is a graph in which the reflectance in the conventional cathode is compared with the average reflectance of the cathodes manufactured in example 1 to 7.

For reference, FIG. 19 illustrates a graph comparing the reflectance of the conventional cathode in which an aluminum layer having a thickness of 300 nm is formed on a glass substrate with the average reflectance of the cathodes manufactured in examples 1 to 7. Here, a line indicated as a Black Cathode is the average reflectance of the cathodes manufactured in examples 1 to 7.

EXAMPLE 8

An aluminum (Al) layer having a thickness of 300 nm is formed on a glass substrate as the first metal layer, an ITO layer having a thickness of 60 nm is formed as the transparent conductive layer, a molybdenum (Mo) layer is formed as the second metal layer, and an ytterbium (Yb) layer having a thickness of 2 nm is formed as the third metal layer, which manufactures the cathode for the organic light emitting device. Here, a LiF layer having a thickness of 1 nm is formed as the electron injection layer, an organic layer including a light emitting layer is formed, an ITO layer having a thickness of 150 nm is formed as the anode, and then a glass is disposed as the transparent plate, which manufactures the organic light emitting device.

Here, N,N-diphenyl-N,N'-bis-[4-(phenyl-m-tolyl-amino)-phenyl]-biphenyl-4,4'-diamine (DNTPD) is used for the Hole Injection Layer (HIL), N,N'-di (1-naphthyl)-N,N'-diphenyl-benzidine (NPB) is used for the Hole Transfer Layer (HTL), and Alq3 is used for the electron transport layer. Further, Rubrene doped with 3% [10-(2-benzothiazolyl)-2,3,6,7-tetrahydro-1,1,7,7-tetramethyl-1H,5H,11H-(1)-benzopyropyrano(6,7-8-I,j)quinolizin-11-one] (DCJTB) is used for a red light emitting material, [Tris(8-hydroxyquinoline)aluminium] (Alq3) doped with 1% [10-(2-benzothiazolyl)-2,3,6,7-tetrahydro-1,1,7,7-tetramethyl-1H,5H,11H-(1)-benzopyropyrano(6,7-8-I,j)quinolizin-11-one] (C545T) is used for a green light emitting material, and [Distyrlanthracene (DSA) doped with 5% anthracenediphenylamine] (DSAamine) is used for a blue light emitting material.

Meanwhile, the organic light emitting device is manufactured while changing the thickness of the molybdenum (Mo) layer, which is the second metal layer. They are illustrated as embodiments 8-1 (Mo 6 nm), 8-2 (Mo 8 nm), 8-3 (Mo 10 nm), and 8-4 (Mo 12 nm), as shown in FIG. 20.

Figure 20:
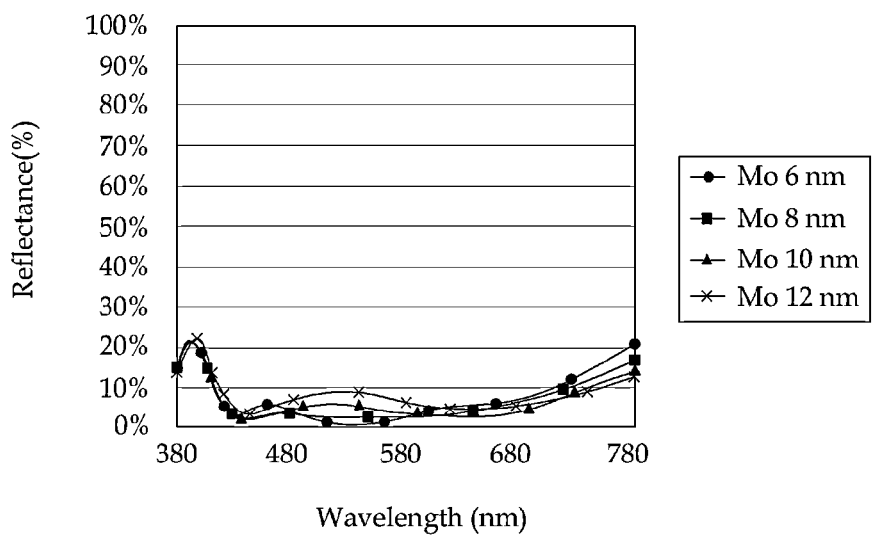
FIG. 20 is a graph in which the external light reflection for the visible ray is measured for the organic light emitting device manufactured in example 8.

FIG. 20 illustrates the external light reflection measured for the visible ray with regard to the manufactured organic light emitting device. Further, FIG. 21 illustrates the luminous reflectance depending on the thicknesses of the molybdenum (Mo) layer based on a result of FIG. 20.

Figure 21:
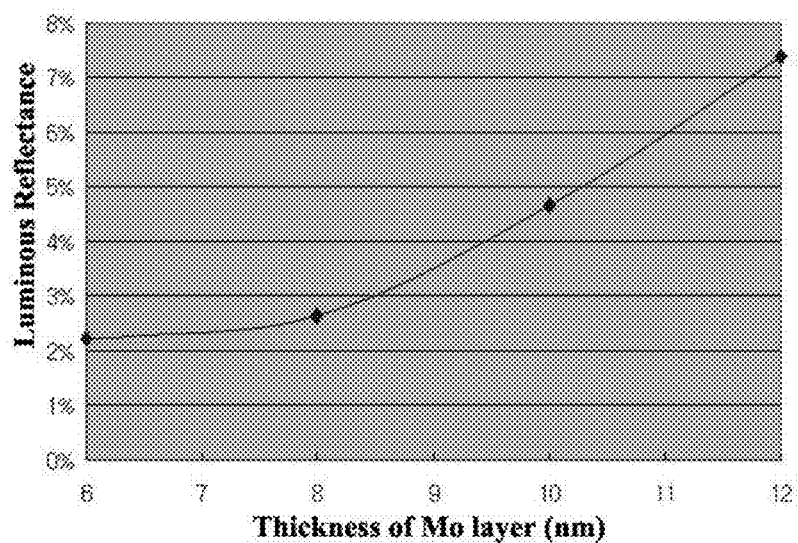
FIG. 21 is a graph in which the luminous reflectance depending on thicknesses of a molybdenum (Mo) layer is indicated based on a result of FIG. 19.

Referring to FIG. 21, when the thickness of the molybdenum (Mo) layer is 6 nm, the luminous reflectance is about 2%. The luminous reflectance of 2% is much lower compared to the luminous reflectance of 66% which is measured when the conventional Al cathode is used, and is lower than the luminous reflectance of 5% of the conventional organic light emitting device equipped with the circularly polarizing plate. Therefore, when a cathode according to the present embodiments is used, it is possible to secure enough visibility by preventing the external light reflection of the organic light emitting device without using the circularly polarizing plate.

EXAMPLE 9

An aluminum (Al) layer having a thickness of 300 nm is formed on a glass substrate as the first metal layer, an ITO layer having a thickness of 50 nm is formed as the transparent conductive layer, and a chromium (Cr) layer is formed as the second metal layer, which manufactures the cathode for the organic light emitting device. Here, a LiF layer having a thickness of 1 nm is formed as the electron injection layer, an organic layer including a light emitting layer is formed, an ITO layer having a thickness of 150 nm is formed as the anode, and then a glass is disposed as the transparent plate, which manufactures the organic light emitting device.

Here, the organic light emitting device is manufactured while changing the thickness of the chromium (Cr) layer which is the second metal layer to 8 nm, 10 nm, and 12 nm. They are illustrated as embodiments 9-1 (Cr 8 nm), 9-2 (Cr 10 nm), and 9-3 (Cr 12 nm), as shown in FIG. 22.

Figure 22:
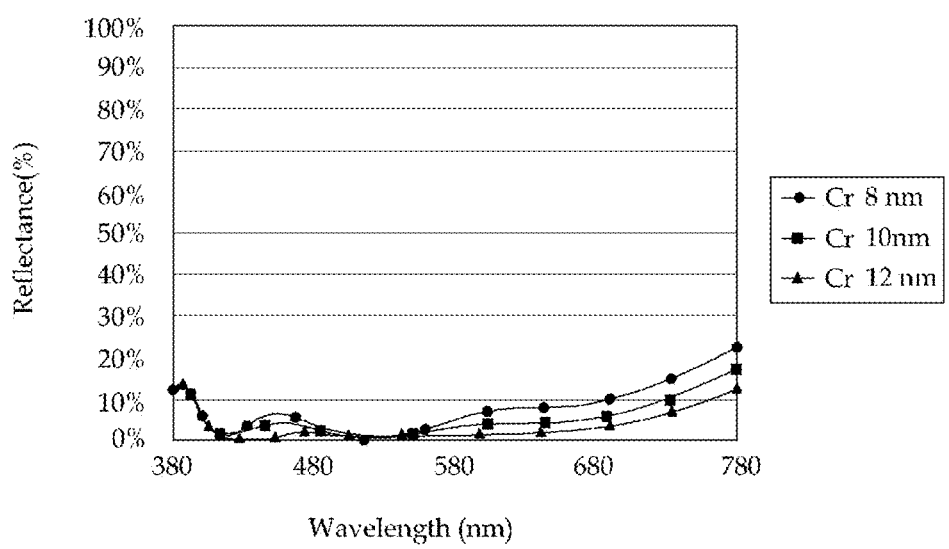
FIG. 22 is a graph in which the external light reflection for the visible ray is measured for the organic light emitting device manufactured in example 9.

FIG. 22 illustrates the external light reflection measured for the visible ray with regard to the manufactured organic light emitting device. Further, FIG. 23 illustrates the luminous reflectance depending on the thicknesses of the chrome (Cr) layer based on a result of FIG. 22.

Figure 23:
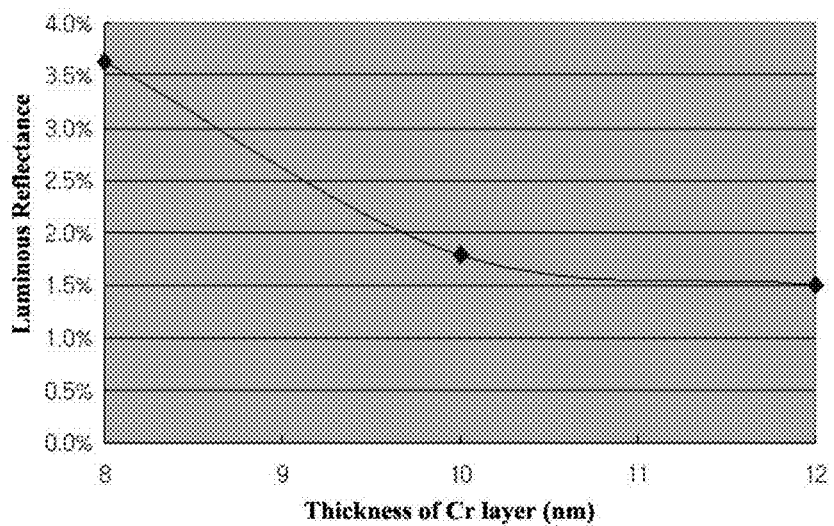
FIG. 23 is a graph in which the luminous reflectance depending on thicknesses of a chrome (Cr) layer is indicated based on a result of FIG. 21.

Referring to FIG. 23, when the thickness of the chromium (Cr) layer is 12 nm, the luminous reflectance is about only 1.5%. Therefore, when the cathode according to the present embodiments is used, it is possible to improve the visibility by sufficiently preventing the external light reflection of the organic light emitting device without using the circularly polarizing plate.

COMPARATIVE EXAMPLE

The comparative example includes an organic light emitting device using the cathode using aluminum (Al) used for the conventional cathode.

Figure 24:
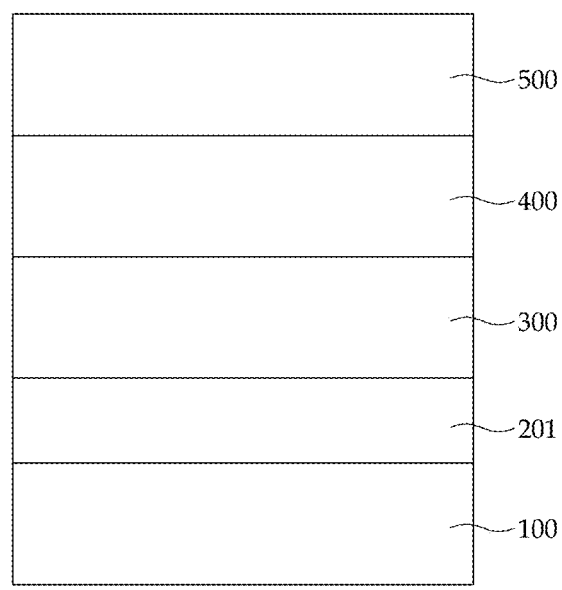
FIG. 24 is a view schematically illustrating a structure of the organic light emitting device according to a comparative example.

Specifically, an aluminum (Al) layer having a thickness of 300 nm is formed on a glass substrate as the first metal layer, to manufacture the cathode of the organic light emitting device. Here, a LiF layer having a thickness of 1 nm is formed as the electron injection layer, an organic layer including a light emitting layer is formed, an TTO layer having a thickness of 150 nm is formed as the anode, and then a glass is disposed as the transparent plate, which manufactures the organic light emitting device. The organic light emitting device according to the comparative example has the structure as that of FIG. 24.

Figure 25:
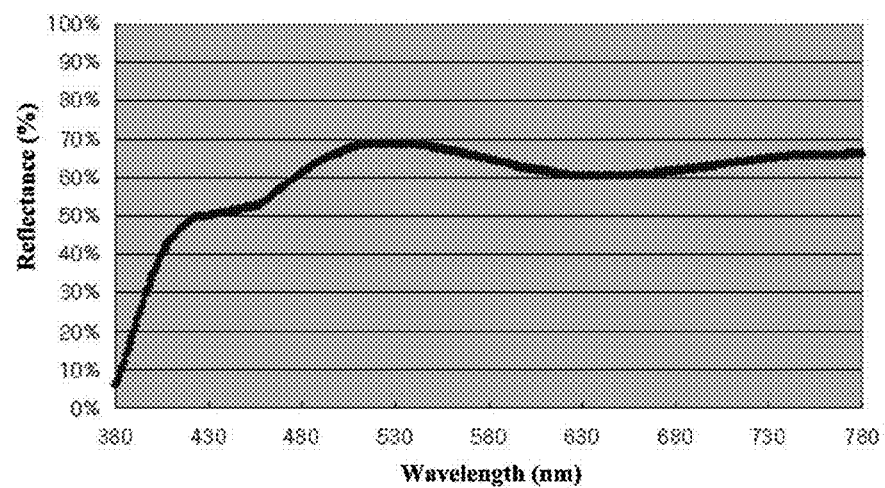
FIG. 25 is a graph in which the external light reflection for the visible ray is measured for the conventional organic light emitting device manufactured in the comparative example.

FIG. 25 illustrates the external light reflection measured for the visible ray with regard to the manufactured organic light emitting device. Referring to FIG. 25, the average reflectance is about 66%.

Figure 26:
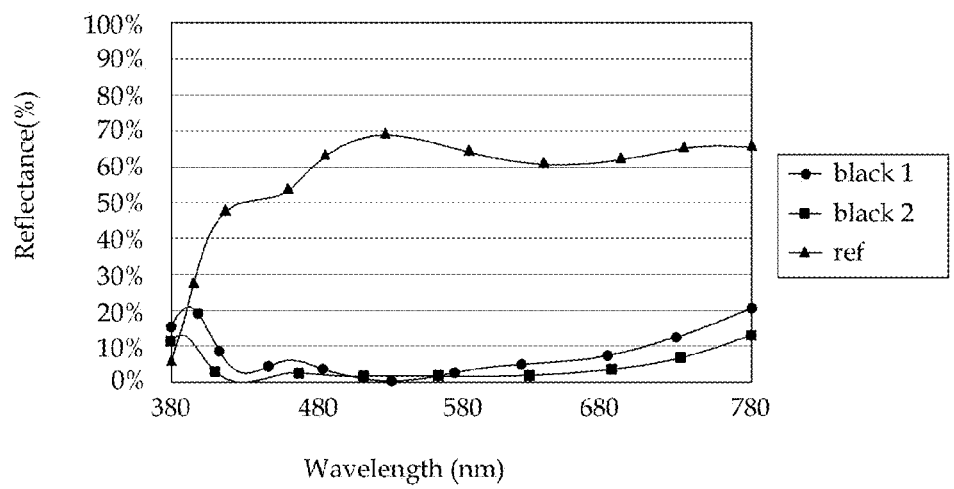
FIG. 26 is a graph in which the average reflectance of the organic light emitting devices manufactured in example 8, the average reflectance of the organic light emitting devices manufactured in example 9, and the reflectance of the organic light emitting device manufactured in the comparative example are indicated. Here, "black 1" refers to the average reflectance of the organic light emitting devices manufactured in example 8, "black 2" refers to the average reflectance of the organic light emitting devices manufactured in example 9, and "ref" refers to the reflectance of the organic light emitting device manufactured in the comparative example.

For the efficient comparison, the average reflectance of the organic light emitting devices manufactured in example 8, the average reflectance of the organic light emitting devices manufactured in example 9, and the average reflectance of the organic light emitting devices manufactured in the comparative example are indicated in FIG. 26, wherein "black 1" indicates the average reflectance of the organic light emitting devices manufactured in example 8, "black 2" indicates the average reflectance of the organic light emitting devices manufactured in example 9, and "ref" indicates the average reflectance of the organic light emitting devices.

The average reflectance of the organic light emitting devices manufactured in example 8 is 2.2%, the average reflectance of the organic light emitting devices manufactured in example 9 is 1.5%, and the average reflectance of the organic light emitting devices manufactured in the comparative example is 66%.

Meanwhile, a contrast ratio of a case, in which the surface reflection of the glass (protective glass) which is the transparent plate is considered, is measured. For comparison, a reference comparative example, in which the circularly polarizing plate is attached to a surface of the transparent plate of the organic light emitting device manufactured in the comparative embodiment to measure a contrast ration, is provided.

Measurement conditions of the contrast ratio are as follows. The on brightness is 500 cd/m$^2$, the off brightness is 0 cd/m$^2$, and the external light brightness is 100 cd/m$^2$. A result of the contrast ratio is as shown in Table 1.

TABLE 1

| Structure | Contrast ratio |
| --- | --- |
| Example 8 | 82 |
| Example 9 | 92 |
| Comparative example | 8 |
| Reference comparative example | 101 |

As shown in Table 1, the organic light emitting device including the cathode for the organic light emitting device according to the present examples has a contrast ratio improved more than 10 times compared to the organic light emitting device including a conventional general metal cathode. Further, the contrast ratio of the organic light emitting device including the cathode for the organic light emitting device according to the present examples is similar to that of the reference comparative example using the circularly polarizing plate. Therefore, the organic light emitting device according to the present examples can achieve the sufficient contrast ratio without using the circularly polarizing plate.

According to the present embodiments, the organic light emitting device includes the multi-layered stacked cathode. When the external light is incident to the organic light emitting device and reflected from the multi-layered cathode, the destructive interference is generated between lights reflected from layers of the cathode so that the external light reflection can be reduced. In the present embodiments, the cathode has a multi-layered structure, and layers of the cathode are formed by using materials having proper work functions, respectively, so that the cathode maintains its own function as the cathode of the organic light emitting device while preventing the external light reflection.

Although exemplary embodiments has been described for illustrative purposes, those skilled in the art will appreciate that various modifications, additions and substitutions are possible, without departing from the scope and spirit of the embodiments as disclosed in the accompanying claims.

What is claimed is:

1. An organic light emitting device comprising:
a substrate;
a first electrode formed on the substrate;
an organic layer formed on the first electrode; and
a second electrode formed on the organic layer,
wherein one of the first electrode and the second electrode is a cathode including a first metal layer, a transparent conductive layer, and a second metal layer, and
the first metal layer, the transparent conductive layer, and the second metal layer are formed so that destructive interference is generated between a light reflected from the first metal layer and lights reflected from the transparent conductive layer and the second metal layer.

2. The organic light emitting device of claim 1, wherein a thickness of the first metal layer is in a range of 50 nm to 500 nm.

3. The organic light emitting device of claim 1, wherein the first metal layer comprises a component selected from the group consisting of Al, Ag, Mg, Cr, Ti, Ni, Au, Ta, Cu, Ca, Fe, Mo, W, Pt, Yb, and Ba, or an alloy thereof.

4. The organic light emitting device of claim 1, wherein an optical thickness of the transparent conductive layer is in a range of $0.15\lambda$ to $0.35\lambda$ for a wavelength $\lambda$ of a visible ray.

5. The organic light emitting device of claim 1, wherein the transparent conductive layer comprises a component selected from the group consisting of ITO, AZO, IGO, GIZO, IZO, and $ZnO_x$, or a mixture thereof, wherein x is an integer from 1 to 20.

6. The organic light emitting device of claim 5, wherein the transparent conductive layer further comprises at least one of a metal and a dielectric material.

7. The organic light emitting device of claim 1, wherein a thickness of the transparent conductive layer is in a range of 20 nm to 100 nm.

8. The organic light emitting device of claim 1, wherein the second metal layer comprises a component selected from the group consisting of Cr, Ti, Mg, Mo, Co, Ni, W, Al, Ag, Au, Cu, Fe, Ca, Pt, and Yb, or an alloy thereof.

9. The organic light emitting device of claim 1, wherein a thickness of the second metal layer is in a range of 1 nm to 25 nm.

10. The organic light emitting device of claim 1, wherein a third metal layer is formed on the second metal layer, and the third metal layer is formed so that a destructive interference between a light reflected from the third metal layer and the light reflected from the first metal layer is generated.

11. The organic light emitting device of claim 10, wherein the third metal layer is formed of a metal having a work function lower than 4.6 eV or an alloy of the metal.

12. The organic light emitting device of claim 10, wherein the third metal layer is formed of a metal having a work function lower than 3.7 eV or an alloy of the metal.

13. The organic light emitting device of claim 10, wherein the third metal layer comprises one selected from the group consisting of Yb, Ca, Al, Ag, Cr, Ti, Mg, Li, Cs, Ba, and K, or an alloy thereof.

14. The organic light emitting device of claim 10, wherein a thickness of the third metal layer is in a range of 1 nm to 15 nm.

15. The organic light emitting device of claim 1, wherein the cathode is the first electrode.

16. The organic light emitting device of claim 1, wherein the second electrode is a transparent electrode and a transparent plate is disposed on the second electrode.

17. A cathode for an organic light emitting device comprising:
- a first metal layer;
- a transparent conductive layer formed on the first metal layer; and
- a second metal layer formed on the transparent conductive layer,
- wherein the first metal layer, the transparent conductive layer, and the second metal layer are formed so that a destructive interference between a light reflected from the first metal layer and lights reflected from the transparent conductive layer and the second metal layer is generated.

18. The cathode for the organic light emitting device of claim 17, wherein a third metal layer is additionally formed on the second metal layer and a destructive interference between a light reflected from the third metal layer and the light reflected from the first metal layer is generated.

* * * * *